United States Patent
Tran

(10) Patent No.: US 8,335,950 B2
(45) Date of Patent: Dec. 18, 2012

(54) TEST AND MEASUREMENT INSTRUMENT WITH BIT-ERROR DETECTION

(75) Inventor: Que Thuy Tran, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 185 days.

(21) Appl. No.: 12/628,402

(22) Filed: Dec. 1, 2009

(65) Prior Publication Data

US 2011/0041047 A1 Feb. 17, 2011

Related U.S. Application Data

(60) Provisional application No. 61/233,430, filed on Aug. 12, 2009.

(51) Int. Cl.
*G06F 11/00* (2006.01)
*G01R 31/28* (2006.01)

(52) U.S. Cl. .......... 714/707; 714/819; 714/737

(58) Field of Classification Search ............ 714/798, 714/719, 799, 819, 704, 707, 708, 724, 737
See application file for complete search history.

(56) References Cited

U.S. PATENT DOCUMENTS

| | | | | |
|---|---|---|---|---|
| 5,742,644 | A * | 4/1998 | Campana, Jr. | 375/316 |
| 6,178,213 | B1 * | 1/2001 | McCormack et al. | 375/355 |
| 6,463,109 | B1 * | 10/2002 | McCormack et al. | 375/355 |
| 7,334,179 | B2 * | 2/2008 | Zhang et al. | 714/764 |
| 7,519,874 | B2 * | 4/2009 | Salant et al. | 714/704 |
| 7,636,387 | B2 * | 12/2009 | Yamaguchi et al. | 375/224 |
| 2008/0148124 | A1 * | 6/2008 | Zhang et al. | 714/752 |

OTHER PUBLICATIONS

Seddik-Ghaleb, A.; Ghamri-Doudane, Y.; Senouci, S.-M.; , "TCP Welcome TCP variant for Wireless Environment, Link losses, and COngestion packet loss ModEls," Communication Systems and Networks and Workshops, 2009. COMSNETS 2009. First International , vol., No., pp. 1-8, Jan. 5-10, 2009.*

* cited by examiner

*Primary Examiner* — Cynthia Britt
(74) *Attorney, Agent, or Firm* — Marger, Johnson & McCollom, P.C.; Thomas F. Lenihan

(57) ABSTRACT

A test and measurement instrument including an input configured to receive a signal and output digitized data; a memory configured to store reference digitized data including a reference sequence; a pattern detector configured to detect the reference sequence in the digitized data and generate a synchronization signal in response; a memory controller configured to cause the memory to output the reference digitized data in response to the synchronization signal; and a comparator configured to compare the reference digitized data output from the memory to the digitized data.

3 Claims, 2 Drawing Sheets

TEST AND MEASUREMENT INSTRUMENT WITH BIT-ERROR DETECTION

CROSS-REFERENCE TO RELATED APPLICATIONS

This application claims priority under 35 U.S.C. §119(e) from U.S. Provisional Application Ser. No. 61/233,430, filed on Aug. 12, 2009 the contents of which are herein incorporated by reference in their entirety.

FIELD OF THE INVENTION

This disclosure relates to test and measurement instruments, in particular to test and measurement instruments with bit-error detection.

BACKGROUND

Test and measurement instruments, such as oscilloscopes, logic analyzers, or the like can be used to analyze digitized data. For example, an oscilloscope can display a waveform, eye diagram, or the like. A logic analyzer can display the digitized data. However, the digitized data can contain errors that may be displayed with the rest of the error-free digitized data.

SUMMARY

An embodiment includes a test and measurement instrument including an input configured to receive a signal and output digitized data; a memory configured to store reference digitized data including a reference sequence; a pattern detector configured to detect the reference sequence in the digitized data and generate a synchronization signal in response; a memory controller configured to cause the memory to output the reference digitized data in response to the synchronization signal; and a comparator configured to compare the reference digitized data output from the memory to the digitized data.

Another embodiment includes a method including receiving digitized data from a signal; matching a sequence of the digitized data with a sequence of reference digitized data; generating a synchronization signal in response to the match; outputting the reference digitized data in response to the synchronized signal; and comparing the output reference digitized signal to the digitized data.

DETAILED DESCRIPTION

Embodiments include test and measurement instruments and techniques where bit errors can be detected in digitized data. As will be described in further detail below, in an embodiment, the detected errors can be analyzed, used in acquisitions of data, or the like.

Figure 1:
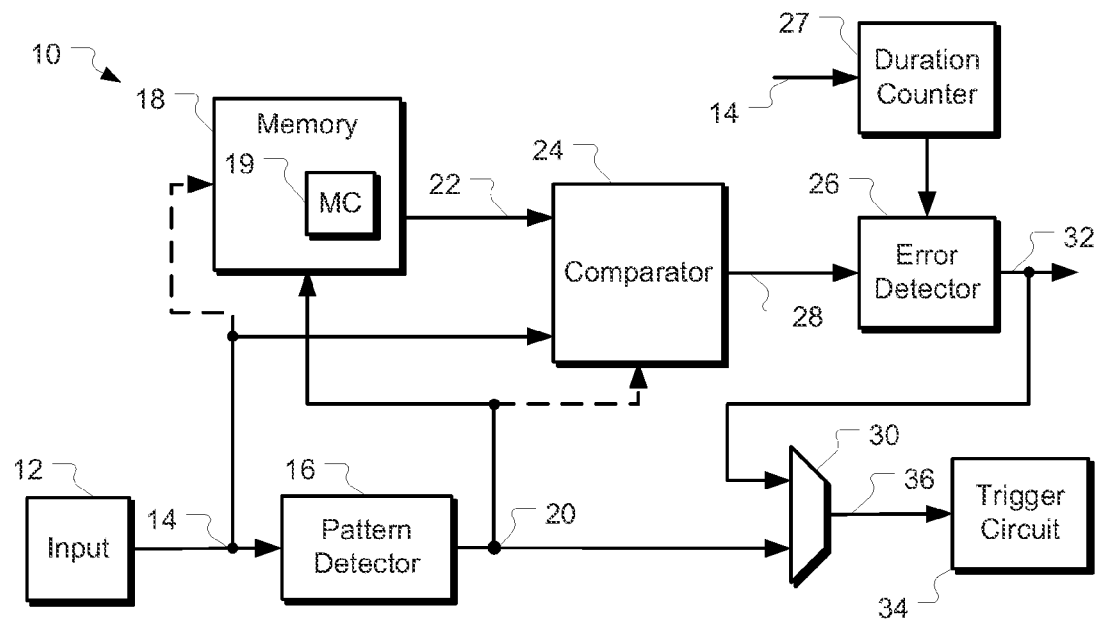
FIG. 1 is a block diagram of a bit-error detector of a test and measurement instrument according to an embodiment.

FIG. 1 is a block diagram of a bit-error detector of a test and measurement instrument according to an embodiment. The test and measurement instrument 10 can be any variety of instruments. For example, the test and measurement instrument 10 can be an oscilloscope, a logic analyzer, a network analyzer, or the like. In this embodiment, the test and measurement instrument 10 includes an input 12, a pattern detector 16 coupled to the input 12, a memory 18, a comparator 24 coupled to the input 12, and an error detector 26 coupled to the comparator 24.

The input 12 is configured to receive a signal and output digitized data 14. In an embodiment, the signal can be an analog signal representing the digitized data 14. For example, the input 12 can include a clock and data recovery circuit (CDR). The CDR can recover the digitized data 14 encoded in the signal. In another embodiment, the input 12 can include an analog to digital converter configured to convert the signal into a digitized representation of the signal. Additional circuitry can convert the digitized signal into digitized data 14. That is, any circuitry that can recover digitized data 14 encoded within the signal can be used as the input 12.

The digitized data 14 can be represented in a variety of formats. For example, the digitized data 14 can be serial data or parallel data. The digitized data 14 can include additional information, signals, or the like associated with the data. For example, as described above, the input 12 can be a CDR. Thus, the digitized data 14 can include a recovered clock. In another example, the digitized data 14 can include framing information, such as frame errors, illegal code information, such as an illegal 8B/10B code sequence, synchronization loss information, or the like. Any such information can be included with the digitized data 14. In another example, digitized data 14 can be retimed de-multiplexed data from the CDR.

The memory 18 can be any variety of memory. For example, the memory 18 can be dynamic memory, static memory, read-only memory, random-access memory, or the like. The memory 18 can be configured to store reference digitized data including a reference sequence. For example, the reference digitized data can be a pseudorandom bit sequence. The reference sequence can be a particular series of ones or a series of zeros appropriate for the length of the pseudorandom pattern. In another example, the reference digitized data can be a user-defined pattern, an industry standard pattern, or the like. The reference sequence can be any sequence of data that is unique within the entire repeated pattern. Accordingly, as will be described below, the reference sequence can be used to align the error detection.

The memory 18 can include a memory controller 19. The memory controller 19 can be configured to cause the memory 18 to output the reference digitized data 22 in response to a synchronization signal 20. In an embodiment, the memory controller 19 can be integrated with the memory 18. However, in another embodiment, the memory controller 19 can be separate from the memory 18. For example, the memory controller 19 can be part of a control system of the test and measurement instrument 10.

The pattern detector 16 can be configured to detect the reference sequence in the digitized data 14 and generate a synchronization signal 20 in response. In an embodiment, the pattern detector 16 can be part of a triggering system. For example, the triggering system can be configured to detect a character, bit sequence, alignment information, or the like within the digitized data 14. The reference sequence is an example of such a pattern in the digitized data 14 that can be detected. Although the pattern detector 16 has been described as part of other circuitry, the pattern detector 16 can be separate from such other systems, such as being an input to a trigger circuit 34.

The pattern detector 16 is configured to output the synchronization signal 20. The synchronization signal 20 can be a single signal or multiple signals. For example, the synchronization signal 20 can include information related to an alignment of the reference sequence within the digitized data 14. The digitized data 14 can be multiple bits wide. The synchronization signal 20 can include an indication of in which bit the reference sequence begins. In another example, such as with an 8B/10B encoding, the digitized data 14 can be grouped in 10-bit blocks. The reference sequence can span more than one of such blocks. The synchronization signal 20 can indicate which of the blocks of the digitized data 14 include the reference sequence, the block with the beginning of the reference sequence, or the like.

In an embodiment, in response to the synchronization signal 20, the memory 18 and can be configured to output the reference digitized data 22. The output reference digitized data 22 can be aligned appropriately to the digitized data 14 such that the reference digitized data 22 that is output to the comparator 24 can be the data that is expected in the digitized data 14. Although the reference sequence can be what generated the synchronization signal 20, the reference sequence can, but need not be the beginning of the reference digitized data 22 output from the memory 18. For example, an amount of time may have passed since the recognition of the reference sequence. The output of the reference digitized data 22 can be controlled appropriately such that even though the reference sequence is no longer present in the digitized data 14, the appropriate reference digitized data 22 is output corresponding to the current expected digitized data 14. In an embodiment, the synchronization signal 20 can reflect such an offset.

The comparator 24 can be configured to compare the reference digitized data 22 output from the memory to the digitized data 14. The comparison can be performed in a variety of ways. In an embodiment, the comparator 24 can be configured to compare bits of the reference digitized data 22 to bits of the digitized data 14 in parallel. The output of the comparator 28 can be parallel data indicating whether the associated bit of the digitized data 14 matches the reference digitized data 22.

The output of the comparator 24 can be provided to an error detector 26. The error detector 26 can be configured to perform various analyses of the digitized data in response to the comparison 28. For example, as will be described in further detail below, the error detector 26 can be configured to indicate if any bit has an error, count the number of errors, indicate a location of one or more errored bits, indicate an error rate, or the like. Such information can be represented in the error signal 32.

Moreover, the test and measurement instrument 10 can include a duration counter 27 coupled to the error detector 26. The duration counter 27 can be configured to reset the error detector 26, enable the error detector 26, or the like. The duration counter can also be configured to output a time duration. Accordingly, the elapsed time can be used to calculate error rates, gate the error detection over a time period, or the like.

In another embodiment, the duration counter 26 can be configured to count a number of elapsed bits. For example, the duration counter 26 can be configured to receive the digitized data 14. In another embodiment, the duration counter 26 can be configured to receive a clock signal associated with the digitized data 14. Thus, the duration counter 26 can determine the number of elapsed bits. Accordingly, error rates such as errored bits per elapsed bits can be calculated.

Furthermore, the duration counter 26 can be configured to measure any span associated with the digitized data 14. That is, as described above, time and number of bits can be used in the analysis of errors. However, other factors can be used, such as number of frames, number of code words, or the like.

The error signal 32 and the synchronization signal 20 can be input to a selector 30. The selector 30 can be configured to select from among the error signal 32, the synchronizations signal 20, other signals, or the like. The selected signal 36 can be input to the trigger circuit 34. Although the synchronization signal 20 from the pattern detector 16 has been described as being input to the selector 30, the synchronization signal 20 and/or the error signal 32 can be supplied to the trigger circuit 34 without selection from among other signals.

Accordingly, as the error signal 32 is available to the trigger circuit 34, an acquisition of the test and measurement instrument 10 can be triggered in response to the error signal 32. For example, an acquisition can be triggered on a single error, on a number of errors, on an error in a particular location within the digitized data 14, or the like. As a result, a user can focus attention on the errored portion of the digitized data 14.

In an embodiment, the reference digitized data can be user defined digitized data. As illustrated by the dashed line input to the memory 18, the digitized data 14 received from the input 12 can be input to the memory 18. Accordingly, the digitized data 14 can be stored in the memory 18. Thus, the stored digitized data 14 can be used as the reference digitized data 22.

As a result, the reference digitized data 22 need not be limited to predefined sequences, sequences generated by an algorithm, or the like. The reference digitized data can be any data sequence the user desires with an appropriate reference sequence. Once the user digitized data is stored in the memory 18, the reference sequence can be identified. For example, the user can provide an address of the sequence within the pattern, the user identify the unique sequence, which the memory controller 19 or other processor can locate in the stored user digitized data, the memory controller 19 can search for a unique sequence in the user digitized data, or the like. Thus, such a reference sequence can be provided to the pattern detector 16 for subsequent comparisons of the user digitized data to newly input digitized data 14.

Figure 2:
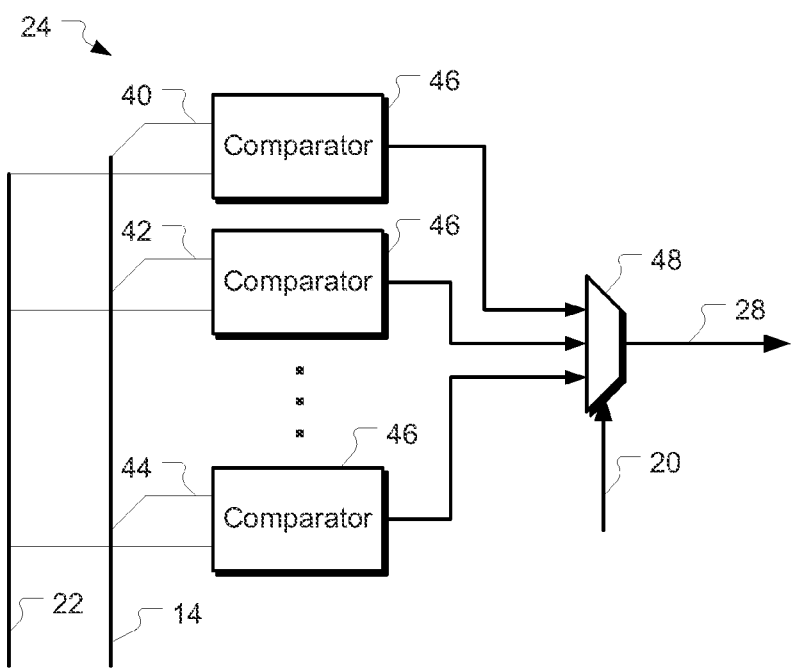
FIG. 2 is a block diagram of an example of a comparator of FIG. 1.

FIG. 2 is a block diagram of an example of a comparator of FIG. 1. IN this embodiment, the comparator 24 includes multiple individual comparators 46. Each of the comparators 46 is configured to receive the reference digitized data 22 and a subset of the digitized data 14. For example, subsets 40, 42, and 44 represent different portions of the digitized data 14. As will be described in further detail below, the subsets 40, 42, and 44 can, but need not be from the same time slice of the digitized data 14.

The outputs of the comparators 46 are coupled to a selector 48. The selector is configured to select from among the outputs of the comparators 46 for the output 28 of the comparator 24. Thus, the selected comparison can occur in any of multiple positions relative to the digitized data 14. In an embodiment, although the output of the reference digitized data 22 has been described above as being aligned to the expected digitized data 14 at the comparator 24, the granularity of blocks of the digitized data 14 can result in the reference sequence spanning portions of the digitized data 14 that are not presented at the same time.

Figure 3:
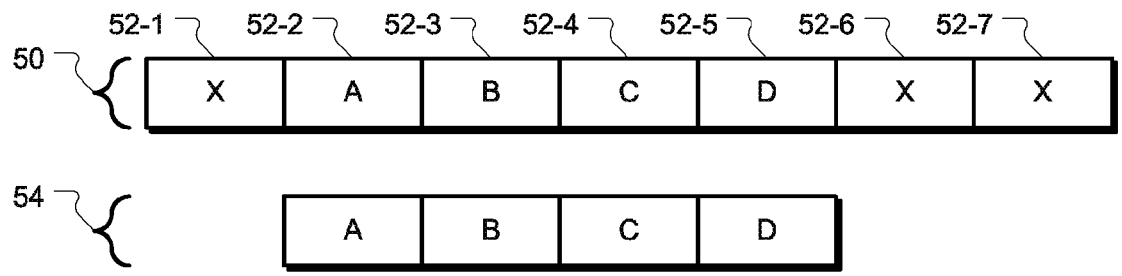
FIG. 3 is a block diagram of an example of data input to a comparator according to an embodiment.

FIG. 3 is a block diagram of an example of data input to a comparator according to an embodiment. In an embodiment, each block 52 can be a sequence of 10 bits of an 8B/10B encoded sequence. The alignment of the reference sequence 54 can depend on the relative phase of the signal received by the input 12. The alignment within a particular block 52 may be predetermined. For example, the input 12 that can receive 8B/10B encoded data can be configured to align the output of the digitized data 14 into the blocks 52. However, the reference sequence 54 in this example spans four blocks 52. Since the reference sequence 54 may begin in any one block 52, a number of blocks 52 can be provided to be analyzed in parallel such that regardless of the beginning block 52 of the reference sequence 54, the entire reference sequence 54 will appear within the provided number of blocks.

In this example, digitized data 50 available to the comparator 24 is seven blocks 52 wide. That is, if the digitized data 14 from the input is generally four blocks wide, an additional three blocks can be buffered, delayed, or the like such that the digitized data 14 from an earlier time can be presented substantially simultaneously with the current digitized data 14. Such buffering, delaying, or the like can be performed in the comparator 24, the input 12, or the like as desired.

In this example, the reference sequence 54 is four blocks 52 long. The reference sequence 54 appears in the digitized data 50 offset by one block. Although a reference sequence 54 has four blocks 52, similar to the width of the digitized data 14 described above, the reference sequence 54 can have any length.

In an embodiment, the number of comparators 46 from FIG. 2 can be four. Each comparator 46 can have a corresponding portion of the digitized data 50 as an input. For example, a first comparator 46 could have blocks 52-1 through 52-4 input as the portion of the digitized data 50. A second comparator 46 could have blocks 52-2 through 52-5 input as the corresponding portion. A third comparator 46 could have blocks 52-3 through 52-6 input as the corresponding portion. A fourth comparator 46 could have blocks 52-4 through 52-7 input as the corresponding portion. Accordingly, In this example, the reference sequence 54 is contained in the digitized data 50 aligned with blocks 52-2 through 52-4. Thus, the output of the second comparator 46 would be the appropriate output while the outputs of the other comparators would not. Referring back to FIG. 2, a selection by the selector 48 can be made in response to the synchronization signal 20. As described above, the synchronization signal 20 can have information related to the alignment of the reference sequence to the digitized data 14. That is, the synchronization signal 20 can indicate that blocks 52-2 through 52-5 are the appropriate blocks to be used for comparison.

In an embodiment, M+N-1 blocks 52 can be provided, where M is the block length of for a reference sequence and N is the block width of the digitized data 14. For example, for a reference sequence 54 having a block length of four and a digitized data 14 block width of four, the digitized data 50 provided to the comparator 24 can include seven blocks 52. Four comparators 46 can be used as there are four positions in the seven blocks 52 where the reference sequence can appear, thus indicating the alignment of the reference digitized data 22 to the digitized data 14. In another example, if the digitized data 14 block width is two and the reference sequence 54 is four, the digitized data 50 can include five blocks 52.

Furthermore, although a block 52 has been described as being 10 bits wide, the blocks 52 can be any width, including one bit wide. In addition, in an embodiment, the number of comparators 46 can be equal to the block width of the digitized data 14. That is, each block 52 of the digitized data 14 can include the beginning of the reference sequence.

Note that although the reference sequence has been used to discuss the alignment of the reference digitized data 22 to the digitized data 14, the reference sequence was only used as illustration. Whatever sequence of the reference digitized data 22 that is output can be compared to the digitized data 14. That is, the reference sequence is used to discuss the alignment of the unique sequence in the digitized data 14.

Figure 4:
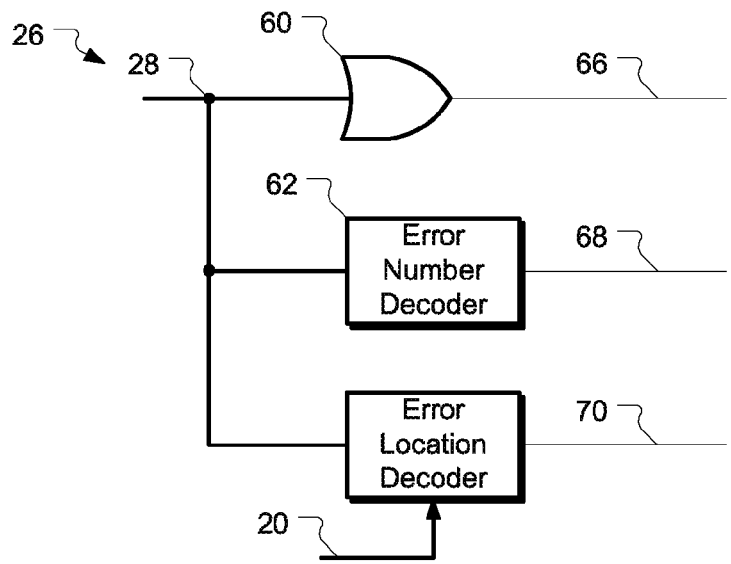
FIG. 4 is a block diagram of an example of an error detector if FIG. 1.

FIG. 4 is a block diagram of an example of an error detector if FIG. 1. In this embodiment, a variety of different circuits are used to analyze the output 28 of the comparator 24. An OR gate 60 can combine the signals of the output 28. For example, the output 28 can be a parallel output with each bit representing whether an error occurred in the corresponding bit of the digitized data 14. The output 28 can be combined into a single error signal 66.

In another example, the number of errors can be counted. For example, an error number decoder 62 can decode the output 28 into a number. The error number decoder 62 can receive a 40 bit wide comparison output 28 and convert the output 28 into an at least 6 bit wide number 68 to accommodate up to 40 bit-errors.

In another example, the location of an error can be decoded. The error location decoder 64 can be configured to identify a location of an error in the comparison output 28. For example, the error location 70 can indicate in which of the 40 input bits of the comparison output 28 the error is located. Although one error has been used as an example, the error location decoder 64 can identify the location of multiple errors.

Although the error detector 26 and the examples of portions of the error detector 26 have been described as separate from the comparator 24, the circuitry of the error detector 26 may be combined with the comparator 24. For example, the error location decoder 64 may also use the synchronization signal 20 as an input to identify in which bit of the digitized data 14 an error exists. Furthermore, although multiple error analysis circuits have been described, any combination of one or more can be used in the error detector 26 as desired.

Figure 5:
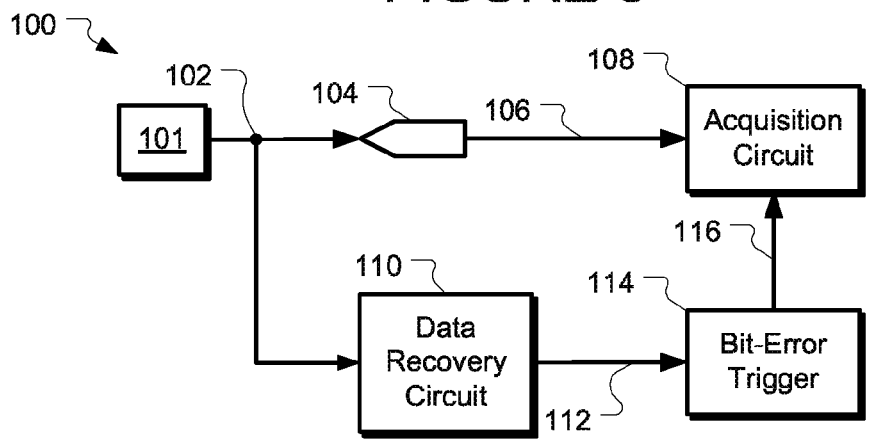
FIG. 5 is a block diagram of a test and measurement instrument according to an embodiment.

FIG. 5 is a block diagram of a test and measurement instrument according to an embodiment. In this embodiment, the test and measurement instrument 100 includes an input 101 configured to receive an input signal 102. A digitizer 104 is coupled to the input 101 and configured to digitize the input signal 102 into a digitized signal 106. The digitized signal 106 can be acquired by an acquisition circuit 108. In an embodiment, the input 101, digitizer 104, and acquisition circuit 108 can be a channel of an oscilloscope, logic analyzer, or the like.

In addition, the test and measurement instrument 100 can also include a data recovery circuit 110. The data recovery circuit 110 can recover digitized data 112 encoded in the input signal 102. Although both the digitizer 104 and the data recovery circuit 110 are digitizing the input signal 102 in some fashion, the digitizer 104 and the data recovery circuit 110 can perform different digitization operations. For example, the digitizer 104 can be a 10-bit analog-to-digital converter of an oscilloscope. Thus, the digitized signal 106 is a digitized version of an analog input signal 102. In contrast, the data recovery circuit 110 can recover the digitized data encoded in the analog input signal 102.

The data recovery circuit 110 can be a variety of circuits. For example, similar to the input 12 described above, the data recovery circuit can be a clock and data recovery circuit (CDR), a demodulator, such as a quadrature amplitude modulation (QAM) demodulator or a frequency modulation (FM) demodulator, an optical receiver, or any other circuit that can recover digitized data encoded within the input signal 102.

As a result, the recovered digitized data 112 can be provided to a bit-error trigger 114. The bit-error trigger 114 can be the bit-error trigger system described above. An acquisition of the acquisition circuit 108 can be triggered in response to the bit-error trigger. Thus, a representation of the data in one format, such as a digitized analog signal format, can be acquired in response to a bit-error or any other resulting information encoded within the input signal 102.

Although the bit-error trigger 114 has been described as triggering an acquisition of the acquisition circuit 108, other trigger circuitry can be used in combination with the bit-error trigger 114. Accordingly, a bit-error can be incorporated into any simple or complex trigger equation.

Although particular embodiments have been described, it will be appreciated that the principles of the invention are not limited to those embodiments. Variations and modifications may be made without departing from the principles of the invention as set forth in the following claims.

The invention claimed is:

1. A test and measurement instrument, comprising:
   an input configured to receive an input analog signal;
   a digitizer coupled to the input and configured to receive and digitize the input analog signal and produce a digitized representation of the input analog signal;
   an acquisition circuit coupled to the digitizer and configured to acquire the digitized representation of the input analog signal;
   a data recovery circuit, coupled to the input via a path not including the digitizer and the acquisition circuit, and configured to recover digitized data encoded in the input analog signal; and
   a bit-error trigger circuit coupled to the data recovery circuit and configured to trigger an acquisition of the acquisition circuit in response to detection of a bit-error in the recovered digitized data;
   wherein the bit-error trigger circuit comprises:
   a pattern detector configured to identify a reference sequence of reference digitized data in the recovered digitized data and generate a synchronization signal in response thereto;
   a memory configured to store reference digitized data and output the reference digitized data in response to the generation of the synchronization signal by the pattern detector; and
   a comparator configured to compare the digitized data to the output reference digitized data and generate a comparison signal in response thereto.

2. The test and measurement instrument of claim 1, wherein the bit-error trigger circuit further comprises an error detector coupled to the comparator and configured to identify a location of a bit-error in the digitized data in response to the comparison signal generated by the comparator.

3. The test and measurement instrument of claim 2, wherein the bit-error trigger circuit further comprises a selector configured to select from among an output of the comparator and an output of the pattern detector.

* * * * *